(12) United States Patent
Veches

(10) Patent No.: US 10,134,712 B1
(45) Date of Patent: Nov. 20, 2018

(54) METHODS AND SYSTEMS FOR IMPROVING POWER DELIVERY AND SIGNALING IN STACKED SEMICONDUCTOR DEVICES

(71) Applicant: Micron Technology, Inc., Boise, ID (US)

(72) Inventor: Anthony D. Veches, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/684,703

(22) Filed: Aug. 23, 2017

(51) Int. Cl.
*H01L 23/48* (2006.01)
*H01L 25/065* (2006.01)
*H01L 23/64* (2006.01)
*H01L 25/00* (2006.01)

(52) U.S. Cl.
CPC ........ *H01L 25/0657* (2013.01); *H01L 23/642* (2013.01); *H01L 25/50* (2013.01); *H01L 2225/06513* (2013.01); *H01L 2225/06531* (2013.01); *H01L 2225/06544* (2013.01); *H01L 2225/06565* (2013.01); *H01L 2225/06582* (2013.01)

(58) Field of Classification Search
CPC ............. H01L 23/492; H01L 23/49822; H01L 23/642; H01L 25/0657; H01L 25/16; H01L 25/50
USPC ........................................................ 257/777
See application file for complete search history.

(56) References Cited

U.S. PATENT DOCUMENTS

| | | |
|---|---|---|
| 2008/0116558 A1 | 5/2008 | Kang et al. |
| 2010/0148373 A1 | 6/2010 | Chandrasekaran |
| 2011/0059593 A1* | 3/2011 | Xue .................... H01L 23/5223 438/396 |
| 2012/0153497 A1 | 6/2012 | Lee |
| 2013/0082352 A1 | 4/2013 | Kim et al. |
| 2013/0293292 A1 | 11/2013 | Droege et al. |
| 2014/0268612 A1* | 9/2014 | Zhang ................... H01L 23/492 361/767 |

OTHER PUBLICATIONS

International Application No. PCT/US2018/035793—PCT International Search Report and Written Opinion, dated Sep. 21, 2018, 15 pages.

\* cited by examiner

*Primary Examiner* — Brook Kebede
(74) *Attorney, Agent, or Firm* — Perkins Coie LLP

(57) ABSTRACT

Semiconductor die assemblies including stacked semiconductor dies having parallel plate capacitors formed between adjacent pairs of semiconductor dies in the stack, and associated systems and methods, are disclosed herein. In one embodiment, a semiconductor die assembly includes a first semiconductor die and a second semiconductor die stacked over the first semiconductor die. The first semiconductor die includes an upper surface having a first capacitor plate formed thereon, and the second semiconductor die includes a lower surface facing the upper surface of the first semiconductor die and having a second capacitor plate formed thereon. A dielectric material is formed at least partially between the first and second capacitor plates. The first capacitor plate, second capacitor plate, and dielectric material together form a capacitor that stores charge locally within the stack, and that can be accessed by the first and/or second semiconductor dies.

25 Claims, 5 Drawing Sheets

METHODS AND SYSTEMS FOR IMPROVING POWER DELIVERY AND SIGNALING IN STACKED SEMICONDUCTOR DEVICES

TECHNICAL FIELD

The present technology generally relates to stacked semiconductor devices. Several embodiments of the present technology are related to improving power delivery to stacked semiconductor devices by forming capacitors between adjacent semiconductor dies in the stack.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted. In some semiconductor die stacks, the semiconductor dies are electrically interconnected using through silicon vias (TSVs). The TSVs enable the semiconductor dies to be stacked close to each other such that adjacent semiconductor dies are spaced apart from each other by only relatively small vertical distances. This, along with the relatively low inductance of the TSVs, enables higher data transfer rates. Also, since the dies are stacked vertically, the total footprint of the stack corresponds to the footprint of the largest die in the stack.

However, one concern with semiconductor die stacks is power delivery. For example, the current draw from semiconductor dies in the stack can be significant when the semiconductor dies are performing high power operations, which can result in poor power delivery to, for example, the uppermost semiconductor dies in the stack. Conventional methods for improving power delivery in semiconductor die stacks include increasing the TSV count of each semiconductor die in the stack to reduce the resistance of the power network. However, increasing the TSV count of the semiconductor dies often requires increasing the size of the semiconductor dies. Accordingly, there remains a need in the art for methods and systems for improving power delivery in semiconductor die stacks.

DETAILED DESCRIPTION

Specific details of several embodiments of semiconductor dies and semiconductor die assembles are described below. In several of the embodiments described below, a semiconductor die assembly includes a stack of semiconductor dies having a capacitor formed between each adjacent pair of semiconductor dies in the stack. In some embodiments, the capacitors are parallel plate capacitors that include (a) an upper plate formed on a lower surface of an upper one of each adjacent pair of semiconductor dies, (b) a lower plate formed on an upper surface of a lower one of each adjacent pair, and (c) a dielectric material between the upper and lower plates. The parallel plate capacitors can store charge locally within the stack of semiconductor dies. When an individual semiconductor die has a spike in its demand for power, the individual semiconductor die can pull power from one or more of the parallel plate capacitors to address that demand. Moreover, in certain embodiments, the plates of the parallel plate capacitors can be formed as part of existing metallization processes for forming interconnects between the stacked semiconductor dies, without adding much cost or complexity to the manufacturing process.

As used herein, the terms "vertical," "lateral," "upper," and "lower" can refer to relative directions or positions of features in the semiconductor dies and semiconductor die assemblies described herein, in view of the orientation shown in the Figures. For example, "upper" or "uppermost" can refer to a feature positioned closer to the top of a page than another feature. These terms, however, should be construed broadly to include semiconductor dies and semiconductor die assemblies having other orientations, such as inverted or inclined orientations where top/bottom, over/under, above/below, up/down, and left/right can be interchanged depending on the orientation.

Figure 1:
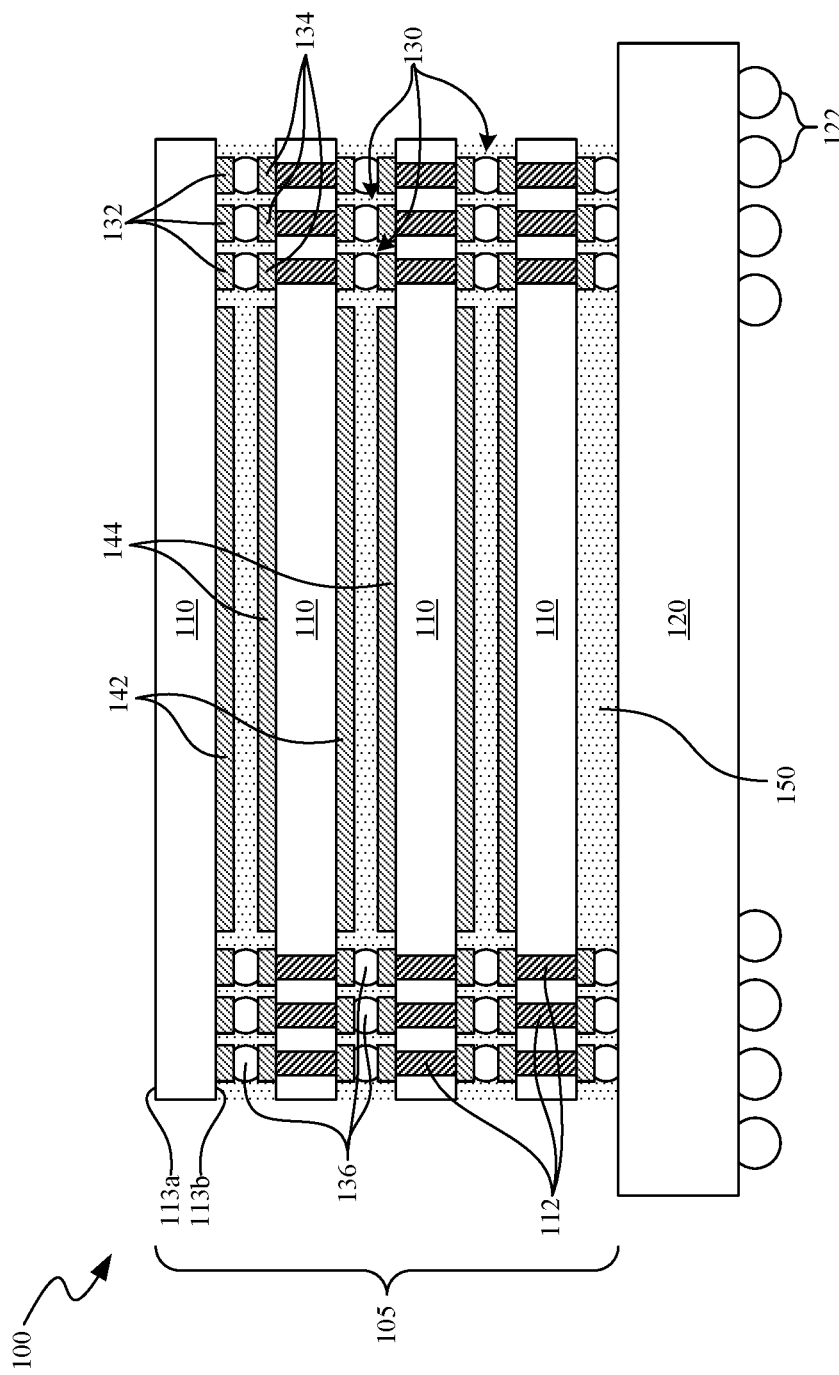
FIG. 1 is a cross-sectional view of a semiconductor die assembly in accordance with an embodiment of the present technology.

FIG. 1 is a cross-sectional view illustrating a semiconductor die assembly 100 ("assembly 100") configured in accordance with an embodiment of the present technology. The assembly 100 includes a stack 105 of semiconductor dies 110 carried by a package substrate 120. The package substrate 120 can include an interposer, a printed circuit board, a dielectric spacer, another semiconductor die (e.g., a logic die), or another suitable substrate. The package substrate 120 is connected to electrical connectors 122 (e.g., solder balls) that electrically couple the assembly 100 to external circuitry (not shown). In some embodiments, the assembly 100 can include an interposer, another logic die, or other suitable structure between the package substrate 120 and a lowermost one of the semiconductor dies 110.

The semiconductor dies 110 can each have integrated circuits or components, data storage elements, processing components, and/or other features manufactured on semiconductor substrates. For example, the semiconductor dies 110 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the semiconductor dies 110 can be identical (e.g., memory dies manufactured to have the same design and specifications), but in other embodiments the semiconductor dies 110 can be different from each other (e.g., different types of memory dies or a combination of controller, logic, and/or memory dies). Further, although the assembly 100 includes four semiconductors dies 110 stacked on the package substrate 120, in other embodiments the assembly 100 can include fewer than four semiconductor dies (e.g., two dies or three dies) or more than four dies (e.g., fives dies, six dies, eight dies, twelve dies, sixteen dies, thirty-two dies, etc.).

As further shown in FIG. 1, the semiconductor dies 110 each have an upper surface 113a and a lower surface 113b opposite the upper surface 113a (collectively "surfaces 113a, 113b"). Some of the semiconductor dies 110 can further include a plurality of vias 112 (e.g., through silicon vias (TSVs)) extending at least substantially through the semiconductor dies 110 (e.g., through a semiconductor substrate thereof). In some embodiments, each via 112 includes an electrically conductive material (e.g., copper) that passes completely through an individual semiconductor die 110, and an electrically insulative material surrounding the electrically conductive material to electrically isolate the via 112 from the remainder of the semiconductor die 110. More particularly, the vias 112 can extend completely through the semiconductor dies 110 such that an upper portion of each via 112 is exposed at the upper surface 113a of an individual semiconductor die 110, and a lower portion of the via 112 is exposed at the lower surface 113b of the individual semiconductor die 110. In this manner, the vias 112 are configured for mechanical and/or electrical connection to other semiconductor dies 110 in the 105 and/or to the package substrate 120. As illustrated in the embodiment of FIG. 1, the uppermost semiconductor die 110 in the stack 105 can be provided without vias since electrical connection through the uppermost semiconductor die 110 (e.g., at the upper surface 113a of the uppermost semiconductor die 110) may not be necessary. In other embodiments, the uppermost semiconductor die 110 can also include a plurality of vias 112, for example, to permit electrical coupling of the uppermost semiconductor die 110 to other circuitry (e.g., additional semiconductor dies, higher level circuitry, etc.) at the upper surface 113a of the uppermost semiconductor die 110. In still other embodiments, the semiconductor dies 110 can be electrically coupled together without the use of TSVs, using other interconnect methods well known to those skilled in the art (including, e.g., shingled wirebonds, face-to-face interconnects, etc.).

The assembly 100 further includes a plurality of electrically conductive interconnects 130 extending between and electrically coupling adjacent semiconductor dies 110 in the stack 105. The interconnects 130 can each include an upper metallization feature 132, a lower metallization feature 134, and an electrically conductive element 136 coupling the upper and lower metallization features 132, 134 (collectively "metallization features 132, 134"). The electrically conductive elements 136 can comprise a solder material, for example tin-silver, indium, or another suitable solder material for forming an electrical and mechanical connection between the metallization features 132, 134 on adjacent semiconductor dies 110. In other embodiments, the electrically conductive elements 136 can be made of other suitable materials and/or have different structures (e.g., copper pillars, bump-on nitride structures, etc.).

The metallization features 132, 134 can be, in general, any suitable under-bump metal (UBM) structure as known in the art, and are electrically coupled to corresponding ones of the vias 112 of the semiconductor dies 110. The upper metallization features 132 are formed on the lower surface 113b of an upper semiconductor die 110 of a pair of adjacent semiconductor dies 110 in the stack 105. Similarly, the lower metallization features 134 are formed on the upper surface 113a of a lower semiconductor die 110 of the pair of adjacent semiconductor dies. More particularly, as shown in FIG. 1, the upper metallization features 132 can be formed over the lower portions of the vias 112 exposed at the lower surface 113b of the upper semiconductor die 110 of the pair of adjacent semiconductor dies. Likewise, the lower metallization features 134 can be formed over the upper portions of the vias 112 exposed at the upper surface 113a of the lower semiconductor die 110 of the pair of adjacent semiconductor dies. Accordingly, the interconnects 130 (i.e., the upper metallization features 132, electrically conductive elements, and lower metallization features 134) can be axially aligned with and electrically couple a pair of vias 112 in the pair of adjacent semiconductor dies. However, in other embodiments, the interconnects 130 need not be axially aligned with the vias 112. For example, a redistribution layer (RDL) or other electrically conductive structure on the lower and/or upper semiconductor dies 110 in the pair of adjacent semiconductor dies can provide a different alignment and coupling between the vias 112 of the adjacent semiconductor dies and the metallization features 132, 134.

The metallization features 132, 134 can comprise any one or combination of suitable conductive materials such as, for example, copper, nickel, gold, silicon, tungsten, etc., and can have a thickness (e.g., height) of between about 1-100 microns (e.g., less than about 10 microns). Moreover, the shape and dimension of the metallization features 132, 134 can vary. For example, in some embodiments, the metallization features 132, 134 have a substantially cylindrical cross-sectional shape and form pillar-like structures. In other embodiments, the metallization features 132, 134 can have other cross-sectional shapes such as rectangular, regular polygonal, irregular polygonal, elliptical, etc.

Figure 2A:
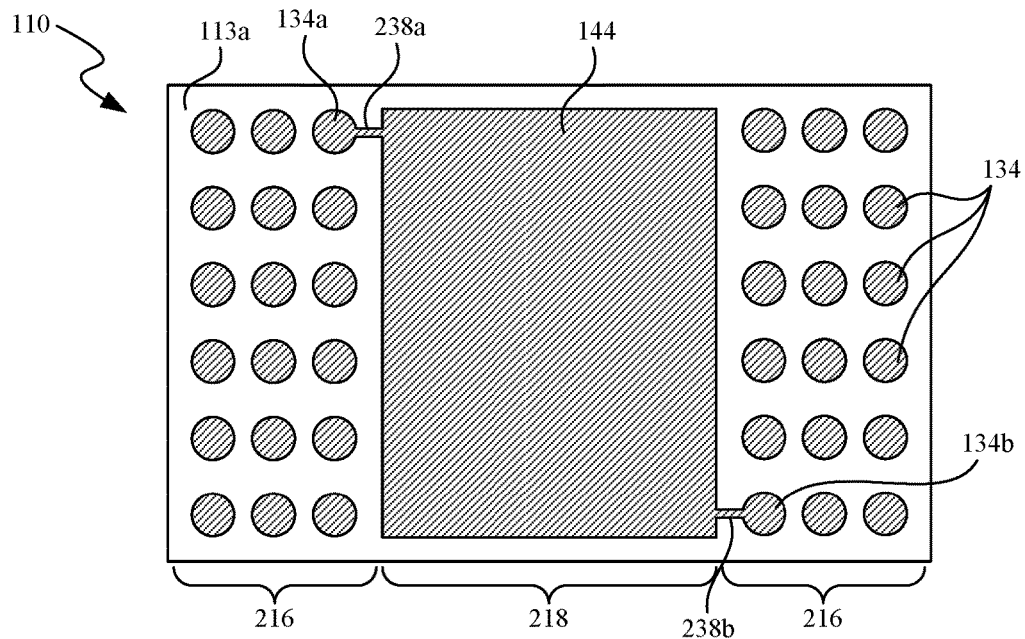
FIGS. 2A and 2B are a top plan view and bottom plan view, respectively, of a semiconductor die configured in accordance with an embodiment of the present technology.
Figure 2B:
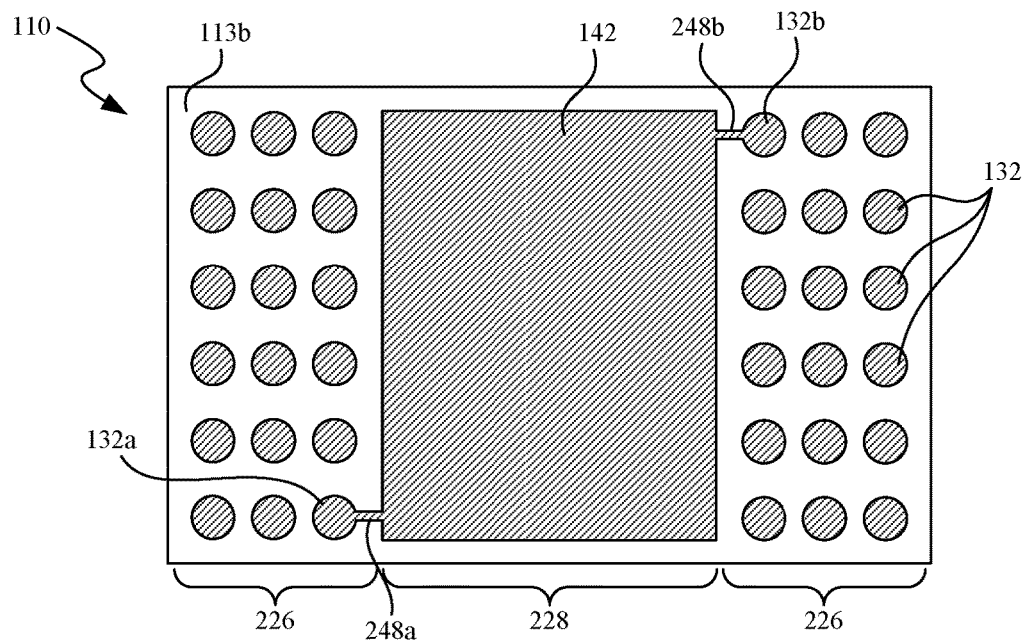

The assembly 100 further includes a plurality of upper capacitor plates 142 and a plurality of lower capacitor plates 144 (collectively "capacitor plates 142, 144"). Each upper capacitor plate 142 is formed on the lower surface 113b of an upper semiconductor die 110 of a pair of adjacent semiconductor dies 110 in the stack 105, and each lower capacitor plate 144 is formed on the upper surface 113a of a lower semiconductor die 110 of the pair of adjacent semiconductor dies. As illustrated in the embodiment of FIG. 1, each upper capacitor plate 142 faces a corresponding lower capacitor plate 144 and is at least partially aligned with the corresponding lower capacitor plate 144. For example, as shown in FIG. 1, each upper capacitor plate 142 is superimposed over the corresponding lower capacitor plate 144 on the adjacent lower semiconductor die 110 (e.g., the capacitor plates 142, 144 are substantially reflectively symmetric about a plane extending between the adjacent semiconductor dies). At least one of the capacitor plates 142, 144 is electrically coupled to a power supply while the other is electrically coupled to ground. For example (as shown in FIGS. 2A and 2B), the capacitor plates 142, 144 can each be electrically coupled to one or more of the interconnects 130, providing a power or ground signal, via conductive traces formed on the surfaces 113a, 113b of the semiconductor dies 110. In other embodiments, the capacitor plates 142, 144 can be electrically coupled to the power supply or ground using other suitable electrical connectors such as wirebonds. Accordingly, a voltage difference can be provided between the opposing capacitor plates 142, 144 formed between each pair of adjacent semiconductor dies 110 in the stack 105.

As described in further detail below with reference to FIGS. 4A-4C, the capacitor plates 142, 144 can be formed as an extension of the metallization process used to form the metallization features 132, 134 (e.g., at the same processing stage and/or simultaneously). Accordingly, because they can be formed from the same process, at least some of the characteristics of the metallization features 132, 134 and capacitor plates 142, 144 can be the same or substantially similar. For example, the metallization features 132, 134 can have the same or a substantially similar thickness as the capacitor plates 142, 144, respectively. Similarly, the metallization features 132, 134 can comprise the same material (e.g., copper, nickel, gold, silicon, tungsten, etc.) as the capacitor plates 142, 144.

The assembly 100 can further include a dielectric material 150 deposited or otherwise formed around and/or between the semiconductor dies 110, the interconnects 130, and the capacitor plates 142, 144 to electrically isolate these components and/or to enhance the mechanical connection between the semiconductor dies 110 in the stack 105. The dielectric material 150 can be a non-conductive epoxy paste, a capillary underfill, a non-conductive film, a molded underfill, and/or include other suitable electrically-insulative materials.

Together, each pair of opposing capacitor plates 142, 144 and the dielectric material 150 therebetween form a mid-stack capacitor (e.g., a parallel plate capacitor) that stores charge within the stack 105. The charge stored on each parallel plate capacitor is proportional to the capacitance (C) of the capacitor, $C=k\epsilon_0 A/d$, where "k" is the relative permittivity of the dielectric material between the plates, "$\epsilon_0$" is the vacuum permittivity, "A" is the area of the capacitor plates, and "d" is the spacing between the capacitor plates. In some embodiments, the mid-stack capacitors formed in the assembly 100 each have a capacitance of 10's to 100's of picoFarads (e.g., more than about 100 picoFarads). Moreover, because the capacitance—and therefore the charge stored by the capacitor—depends inversely on the distance between the capacitor plates 142, 144, the capacitance can be increased as the vertical distance (e.g., the spacing) between the semiconductor dies 110 in the stack 105 is reduced. The spacing between the semiconductor dies 110 in the stack 105 depends largely on the size of the interconnects 130. Therefore, as technology progresses to reduce the size of the interconnects 130 and to thereby reduce the overall height of the assembly 100, the capacitance of the mid-stack capacitors described herein can be correspondingly increased. Furthermore, in some embodiments, the dielectric material 150 can be selected based on its dielectric qualities (e.g., its relative permittivity or other characteristics) so as to increase the capacitance of the mid-stack capacitors.

In general, each mid-stack capacitor in the stack 105 adds capacitance to the power network of the stack 105 that can be drawn on by the semiconductor dies 110 when needed. For example, when an individual semiconductor die 110 in the stack 105 has a spike in its need for power (e.g., when the individual semiconductor die 110 performs a power intensive operation such as initiating an access, read operation, etc.) the individual semiconductor die 110 can draw some of the power it needs from one or more of the mid-stack capacitors. The mid-stack capacitors offer a more localized power source than an external power supply, whose power must be routed through the package substrate 120 and up through the vias 112 and interconnects 130. Accordingly, the mid-stack capacitors can quickly address some of the short term power demands of the semiconductor dies 110, which the power supply may be slow in responding to depending on the power needs of other semiconductor dies 110 in the stack 105 (e.g., lower semiconductor dies in the stack). Conventional methods to improve the power delivery of a semiconductor die stack increase the TSV count of each semiconductor die in the stack to include more power and ground connections to thereby reduce the resistance of the power network. However, increasing the TSV count of the semiconductor dies requires increasing the size of the semiconductor dies. The present technology advantageously increases the capacitance of the power network in the assembly 100 such that the assembly 100 can better meet the power demands of the semiconductor dies 110 in the stack 105, without increasing the TSV count and/or size of the semiconductor dies 110.

Moreover, adding capacitance to the power network can improve the signal integrity of signals transmitted through the stack 105 on one or more of the vias 112 and/or the performance of the semiconductor dies 110. For example, the mid-stack capacitors can act as decoupling capacitors to shunt noise that may otherwise be carried through the stack 105 (e.g., voltage spikes or ground bounce caused by other dies in the stack) and that may hinder the performance of the semiconductor dies 110. The mid-stack capacitors may also help address problems with inductive ringing (e.g., ringing due to package self-inductance in memory devices). For examples, the mid-stack capacitors can help minimize the inductive path for the power supply and ground connections to thereby improve the performance of the semiconductor dies 110.

As shown in FIG. 1, a mid-stack capacitor is formed between each pair of adjacent semiconductor dies 110 in the stack 105. The mid-stack capacitors can be electrically coupled in parallel or in series, or in some combination thereof. However, in some embodiments, the stack 105 may be provided with only one mid-stack capacitor formed between a single pair of adjacent semiconductor dies 110, or with any other number of mid-stack capacitors. In some embodiments, an additional capacitor can be formed between the package substrate 120 and the lowermost semiconductor die 110 in the stack 105 by providing (a) a lower capacitor plate 144 on the package substrate 120, (b) a corresponding upper capacitor plate 142 on the lower surface 113b of the lowermost semiconductor die 110, and (c) a dielectric material (e.g., the dielectric material 150) therebetween. Similarly, in some embodiments, a capacitor can be formed between the upper surface 113a of the uppermost semiconductor die 110 in the stack 105 and any external components connected thereto.

FIGS. 2A and 2B are a top and bottom plan view, respectively, of one of the semiconductor dies 110 of the assembly 100 shown in FIG. 1 having metallization features and a capacitor plate on each of the surfaces 113a, 113b of the semiconductor die 110, in accordance with embodiments of present technology. The illustrated semiconductor die 110 can be one of the semiconductor dies 110 in the middle of the stack 105 (e.g., having an adjacent semiconductor die 110 both above and below), as the lowermost and topmost semiconductor dies 110 in the stack 105 may be formed without a capacitor plate and/or metallization features on their lower and upper surfaces 113b, 113a, respectively (as illustrated in FIG. 1).

More particularly, FIG. 2A illustrates the upper surface 113a of the semiconductor die 110 having one or more peripheral regions 216 (e.g., a laterally outboard regions)

and a central region 218. The lower metallization features 134 are formed on the peripheral region 216, and the lower capacitor plate 144 is formed on the central region 218 of the upper surface 113a. The lower capacitor plate 144 can be electrically coupled to one or more of the lower metallization features 134 via conductive traces 238 (shown individually as conductive traces 238a and 238b). For example, as illustrated in the embodiment of FIG. 2A, the lower capacitor plate 144 can be electrically coupled to a first lower metallization feature 134a via the conductive trace 238a and to a second lower metallization feature 134b via the conductive trace 238b. The first and second lower metallization features 134a, 134b can be electrically coupled to either ground or to a power supply. In some embodiments, the conductive traces 238 are formed as part of the same metallization process as the lower metallization features 134 and lower capacitor plate 144.

FIG. 2B illustrates the lower surface 113b of the semiconductor die 110 having one or more peripheral regions 226 (e.g., a laterally outboard regions) and a central region 228. The upper metallization features 132 are formed on the peripheral region 226, and the upper capacitor plate 142 is formed on the central region 228 of the lower surface 113b. The upper capacitor plate 142 can be electrically coupled to one or more of the upper metallization features 132 via conductive traces 248 (shown individually as conductive traces 248a and 248b). For example, as illustrated in the embodiment of FIG. 2B, the upper capacitor plate 142 can be electrically coupled to a first upper metallization feature 132a via the conductive trace 248a and to a second upper metallization feature 132b via the conductive trace 248b. The first and second upper metallization features 132a, 132b can be electrically coupled to either ground or to a power supply. In some embodiments, the conductive traces 248 are formed as part of the same metallization process as the upper metallization features 132 and upper capacitor plate 142.

In some embodiments, the capacitor plates 142, 144 can be electrically coupled to the same vias (FIG. 1) of the semiconductor die 110. Accordingly, the capacitor plates 142, 144 can either be both electrically coupled to ground or both electrically coupled to the power supply. In such embodiments, each alternating semiconductor die 110 in the stack 105 can be provided with the same configuration of capacitor plates 142, 144 such that a voltage difference exists between opposing capacitor plates 142, 144 formed between adjacent pairs of semiconductor dies 110 in the stack 105. However, in other embodiments, the capacitor plates 142, 144 on the semiconductor die 110 can be electrically coupled to different (e.g., separate) ones of the vias 112 such that one of the capacitor plates 142, 144 is electrically coupled to ground, while the other is electrically coupled to the power supply. For example, in such embodiments, each upper capacitor plate 142 in the stack 105 can be electrically coupled to the power supply while each lower capacitor plate 144 is electrically coupled to ground.

Referring to both FIGS. 2A and 2B together, the capacitor plates 142, 144 can be formed to fill a substantial area of the surfaces 113b, 113a, respectively, that are not otherwise occupied by the metallization features 132, 134. For example, as illustrated in both FIGS. 2A and 2B, the semiconductor die 110 can have metallization features 132, 134 arranged in rows at the peripheral regions 216, 226 of the surfaces 113a, 113b. By forming the capacitor plates 142, 144 on the central regions 218, 228 and to have a rectangular cross section (e.g., a rectangular planform shape), the capacitor plates 142, 144 can occupy a substantial area of the surfaces 113a, 113b that is not occupied by the metallization features 132, 134 (whose position may be limited to a location of the vias 112). For example, in some embodiments, the capacitor plates 142, 144 can cover an area greater than about 25% of the surface area of the surfaces 113a, 113b of the semiconductor die 110, respectively. In some embodiments, the capacitor plates 142, 144 can cover an area greater than about 50% of the surface area of the surfaces 113a, 113b. In still other embodiments, the capacitor plates 142, 144 can cover an area greater than about 75% of the surface area of the surfaces 113a, 113b. However, the coverage of the capacitor plates 142, 144 is not limited and the capacitor plates 142, 144 can cover any suitable portion of the surfaces 113a, 113b. Moreover, in certain embodiments, the metallization features 132, 134 may be formed on a different region of the semiconductor die 110, and can have different arrangements. In such embodiments, the size, shape, and positioning of the capacitor plates can be selected to match the layout of the metallization features 132, 134.

Figure 3A:
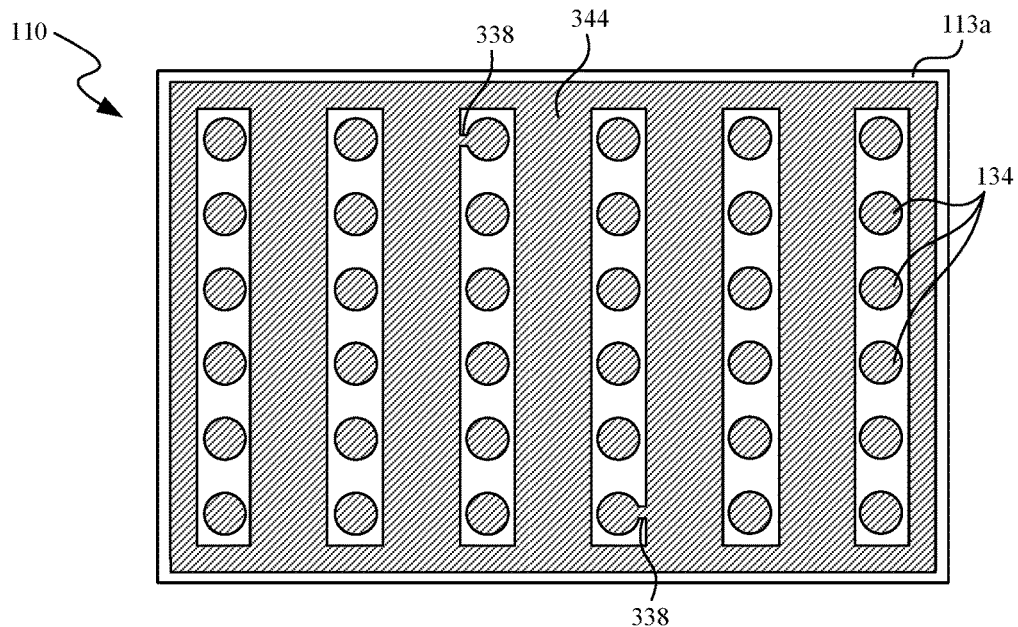
FIGS. 3A and 3B are a top plan view and bottom plan view, respectively, of a semiconductor die configured in accordance with another embodiment of the present technology.
Figure 3B:
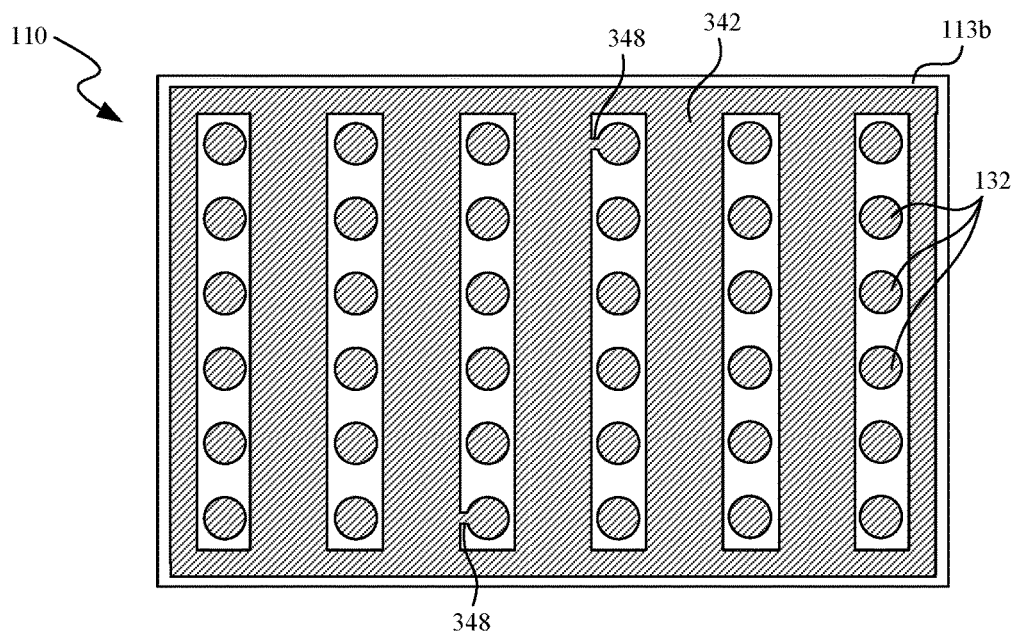

For example, FIGS. 3A and 3B are a top and bottom plan view, respectively, of one of the semiconductor dies 110 of the assembly 100 having a different arrangement of metallization features and capacitor plates on the surfaces 113a, 113b of the semiconductor die 110, in accordance with another embodiment of the present technology. Referring to both FIGS. 3A and 3B together, the metallization features 132, 134 are arranged in rows that are evenly spaced along the surfaces 113b, 113a, respectively. The metallization features 132, 134 can be arranged in this manner to, for example, match the arrangement of the vias (e.g., the vias 112) of the semiconductor die 110. As shown in FIG. 3A, a lower capacitor plate 344 is formed on the upper surface 113a of the semiconductor die 110 and electrically coupled to one or more of the lower metallization features 134 (e.g., corresponding to power or ground) via conductive traces 338. Similarly, as shown in FIG. 3B, an upper capacitor plate 342 is formed on the lower surface 113b of the semiconductor die 110 and electrically coupled to one or more of the upper metallization features 132 via conductive traces 348 (e.g., corresponding to power or ground). In some embodiments, both the upper and lower capacitor plates 342, 344 are electrically coupled to the same vias 112 (FIG. 1) of the semiconductor die 110 (e.g., such that both plates are grounded or both plates are connected to a power supply), while in other embodiments, the upper and lower capacitor plates 342, 344 are electrically coupled to different ones of the vias 112 (e.g., such that one of the plates is grounded while the other is connected to the power supply). Moreover, both the upper and lower capacitor plates 342, 344 have a generally rectilinear shape and are formed on a substantial portion of the open surface area around the metallization features 132, 134. Such an arrangement can generally allow for the upper and lower capacitor plates 342, 344 to have the greatest area given the layout of the metallization features 132, 134.

In general, the size, shape, and positioning of the capacitor plates described herein can be selected to maximize or nearly maximize the area of the capacitor plates, so as to increase the capacitance of mid-stack capacitors formed in a die stack. More particularly, each capacitor plate can be formed on the open surface area of a semiconductor die that would otherwise be unoccupied by metallization features. Thus, the capacitor plates described herein are adaptable to the specific configuration of the semiconductor dies on which they are formed (e.g., to the arrangement of vias, metallization features, and/or other features), while also adding little or no additional overhead to the die assembly (e.g., not increasing the planform size or thickness of the die assembly).

Moreover, each semiconductor die can include a single capacitor plate on a surface thereof, as described in connection with several embodiments above, or more than one capacitor plate on a surface thereof. For example, a semiconductor die as described herein can include multiple discrete capacitor plates to match the room available on the surface of the semiconductor die given the existing metallization structures. The discrete capacitor plates may be electrically coupled (e.g., via conductive traces) or electrically isolated. In some embodiments, adjacent semiconductor dies may each have multiple discrete capacitor plates on facing surfaces thereof so as to form multiple discrete parallel plate capacitors between the adjacent semiconductor dies. The multiple parallel plate capacitors can operate independent of each other, or may be connected in parallel, in series, etc.

Figure 4A:
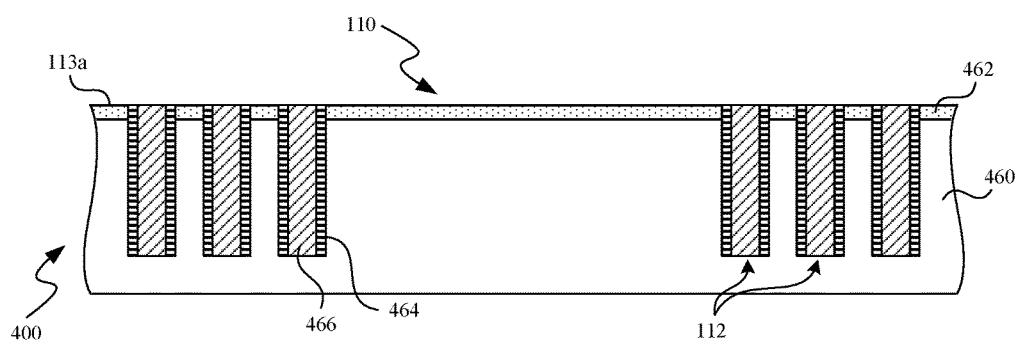
FIGS. 4A-4C are cross-sectional views illustrating a semiconductor die at various stages of manufacturing in accordance with an embodiment of the present technology.
Figure 4B:
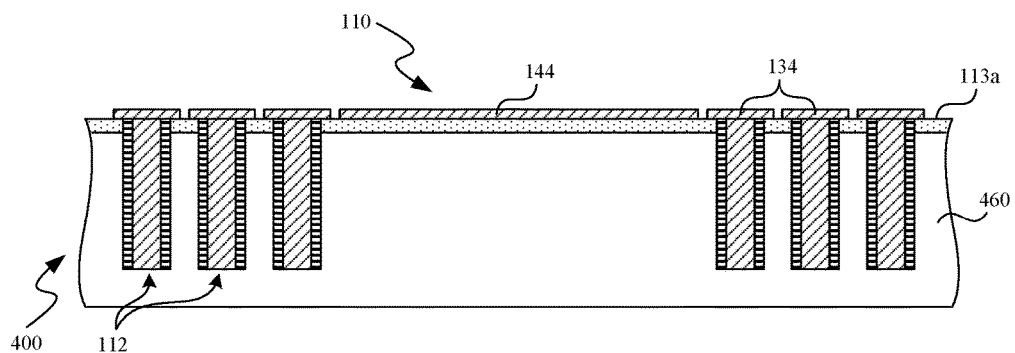
Figure 4C:
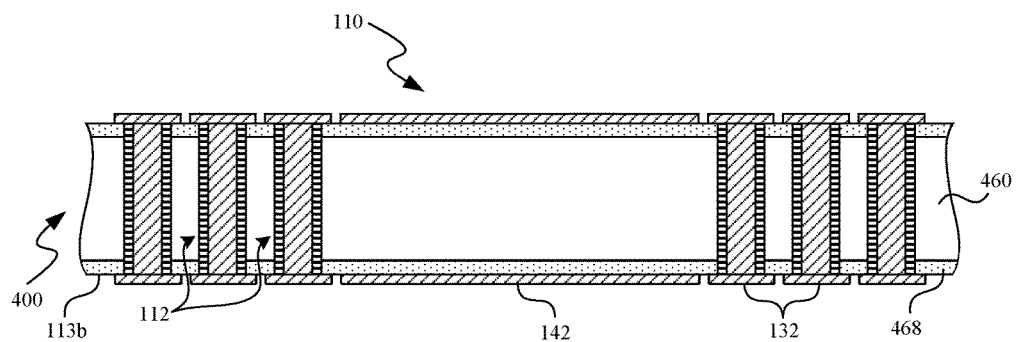

FIGS. 4A-4C are cross-sectional views illustrating various stages in a method of manufacturing a semiconductor die having metallization features and capacitor plates formed thereon, in accordance with embodiments of the present technology. In the embodiment illustrated in FIGS. 4A-4C, a plurality of semiconductor dies 110 can be formed at discrete areas of a substrate assembly 400 (e.g., a semiconductor wafer or panel). The substrate assembly 400 includes a semiconductor material 460 and a dielectric material 462 on an upper side of the semiconductor material 460. Although only a single semiconductor die 110 is illustrated in FIGS. 4A-4C, in practice the substrate assembly 400 typically has several hundred or even over 1,000 individual semiconductor dies.

Referring to FIG. 4A, at this stage of processing, the vias 112 have been formed in the semiconductor material 460. As will be readily understood by those skilled in the art, the vias 112 can be made by etching a high-aspect-ratio hole into the semiconductor material 460 and filling it with one or more materials in one or more deposition and/or plating steps. For example, in the embodiment shown in FIG. 4A, the vias 112 include a dielectric liner 464 and a conductive plug 466 within the dielectric liner 464. As further shown in FIG. 4A, upper portions of the vias 112 are exposed at the upper surface 113a of the semiconductor die 110.

FIG. 4B illustrates the substrate assembly 400 after forming the lower metallization features 134 over the upper portions of the vias 112, and after forming the lower capacitor plate 144 on the upper surface 113a of the semiconductor die 110. Notably, the lower capacitor plate 144 can be formed as an extension of the metallization process used to form the lower metallization features 134. The metallization process can be any suitable metallization process (e.g., a front-side metallization or under-bump metallization process) known in the art. In some embodiments, for example, the lower metallization features 134 are formed by depositing a copper seed structure onto the dielectric material 462 and the upper portions of the vias 112, forming a mask on the copper seed structure having openings aligned with the upper portions of the vias 112, plating copper onto the seed structure, and then plating one or more other materials over the copper to form the lower metallization features 134. The lower capacitor plate 144 can be formed as part of such a process by adjusting the mask pattern to include one or more openings corresponding to a desired shape, position, and size of the lower capacitor plate 144 and any trace(s) (e.g., the traces 238 in FIG. 2A) connecting the lower capacitor plate 144 to one or more of the lower metallization features 134. In some embodiments, after forming the lower metallization features 134 and lower capacitor plate 144 (and, in some embodiments, the electrically conductive elements 136), the mask is removed and the exposed portions of the seed structure are removed using a suitable wet etch to isolate the lower metallization features 134 and the lower capacitor plate 144.

FIG. 4C illustrates the substrate assembly 400 after (a) thinning the semiconductor material 460 to expose the lower surface 113b of the semiconductor die 110 and lower portions of the vias 112 (e.g., using back grinding, dry etching processes, chemical etching processes, chemical mechanical polishing (CMP), etc.); (b) forming a dielectric material 468 on a lower side of the semiconductor material 460; (c) forming the upper metallization features 132 over the lower portions of the vias 112; and (d) forming the upper capacitor plate 142 on the lower surface 113b of the semiconductor die 110. The upper capacitor plate 142 can be formed as an extension of the metallization process used to form the upper metallization features 132, which can be any suitable process known in the art (e.g., a back-side metallization or under-bump metallization process). In some embodiments, the metallization process used to from the lower metallization features 134 and lower capacitor plate 144 can be the same metallization process used to form the upper metallization features 132 and upper capacitor plate 142. In other embodiments, the processes may be different. For example, at least some of the stages illustrated in FIGS. 4A-4C need not be carried out for the uppermost and lowermost dies in the stack, which can be formed without capacitor plates and/or metallization features on at least one surface. Once processing of the substrate assembly 400 is complete, the semiconductor dies 110 can be singulated from the substrate assembly 400 and incorporated into a die assembly (e.g., the assembly 100 shown in FIG. 1).

Notably, the capacitor plates 142, 144 can be formed without adding significant additional costs or complexity to existing methods for forming the metallization features 132, 134, since the capacitor plates 142, 144 can be formed as an extension of those methods. Likewise, conductive traces (e.g., the traces 238/248 and 338/348 shown in FIGS. 2A-3B) can also be easily formed as part of the same methods, for electrically coupling the capacitor plates 142, 144 to corresponding metallization features 132, 134 to provide a suitable voltage difference between the plates.

Figure 5:
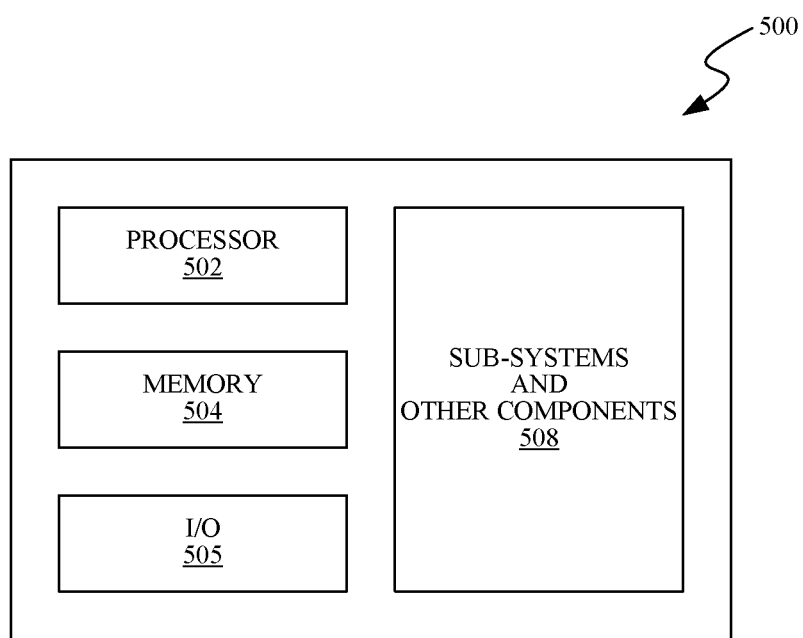
FIG. 5 is a schematic view of a system that includes a semiconductor die assembly configured in accordance with embodiments of the present technology.

Any one of the semiconductor devices having the features described above with reference to FIGS. 1-4C can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 505, and/or other subsystems or components 508. The semiconductor die assembly 100 and semiconductor dies 110 described above with reference to FIGS. 1-4C can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other example, the system 500 can be housed in a single unit or distributed over multiple interconnected units, e.g., through a communication network. The components of the system 500 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor die assembly, comprising:
   a first semiconductor die having a lower surface and an upper surface opposite the lower surface;
   a second semiconductor die having a lower surface and an upper surface opposite the lower surface, the second semiconductor die stacked over the first semiconductor die such that the lower surface of the second semiconductor die faces the upper surface of the first semiconductor die; and
   a mid-stack capacitor having a first capacitor plate on the upper surface of the first semiconductor die, a second capacitor plate on the lower surface of the second semiconductor die, and a dielectric material between the first capacitor plate and the second capacitor plate.

2. The semiconductor die assembly of claim 1 wherein the mid-stack capacitor is a parallel plate capacitor.

3. The semiconductor die assembly of claim 2 wherein the parallel plate capacitor has a capacitance greater than about 100 pF.

4. The semiconductor die assembly of claim 1, further comprising:
   at least one first through-silicon via (TSV) extending through the first semiconductor die;
   a first metallization feature on the upper surface of the first semiconductor die and electrically coupled to the first TSV; and
   a second metallization feature on the lower surface of the second semiconductor die and electrically coupled to the first metallization feature.

5. The semiconductor die assembly of claim 4 wherein the first metallization feature is made from the same metal material as the first capacitor plate, and wherein the second metallization feature is made from the same metal material as the second capacitor plate.

6. The semiconductor die assembly of claim 4 wherein the first metallization feature has substantially the same thickness as the first capacitor plate, and wherein the second metallization feature has substantially the same thickness as the second capacitor plate.

7. The semiconductor die assembly of claim 4, further comprising at least one second TSV extending through the second semiconductor die, wherein the second metallization feature is electrically coupled to the second TSV.

8. The semiconductor die assembly of claim 7 wherein the first TSV, second TSV, first metallization feature, and second metallization feature are axially aligned.

9. The semiconductor die assembly of claim 1 wherein the first capacitor plate and the second capacitor plate have rectangular planform shapes that are reflectively symmetric about a plane extending therebetween.

10. The semiconductor die assembly of claim 1 wherein the first capacitor plate has a surface area greater than about 25% of an area of the upper surface of the first semiconductor die.

11. The semiconductor die assembly of claim 1, further comprising:
    a third semiconductor die having a lower surface and an upper surface opposite the lower surface, the third semiconductor die stacked over the second semiconductor die such that the upper surface of the second semiconductor die faces the lower surface of the third semiconductor die; and
    another mid-stack capacitor having a third capacitor plate on the upper surface of the second semiconductor die, a fourth capacitor plate on the lower surface of the third semiconductor die, and a dielectric material between the third capacitor plate and the fourth capacitor plate.

12. A semiconductor die assembly, comprising:
    a stack of semiconductor dies; and
    between each adjacent pair of semiconductor dies in the stack of semiconductor dies,
       a plurality of interconnects electrically coupling at least the adjacent pair of semiconductor dies, and
       a parallel plate capacitor including an upper plate formed on a lower surface of an upper one of the adjacent pair of semiconductor dies, a lower plate formed on an upper surface of a lower one of the adjacent pair of semiconductor dies, and a dielectric material between the upper and lower plates.

13. The semiconductor die assembly of claim 12 wherein the upper plates are electrically coupled to a power supply, and wherein the lower plates are electrically coupled to ground.

14. The semiconductor die assembly of claim 12 wherein each upper plate is electrically coupled to at least a first one of the interconnects, and wherein each lower plate is electrically coupled to at least a second one of the interconnects.

15. The semiconductor die assembly of claim 12 wherein each interconnect includes an upper metallization feature formed on the lower surface of the upper one of the adjacent pair of semiconductor dies and a lower metallization feature formed on the upper surface of the lower one of the adjacent pair of semiconductor dies.

16. The semiconductor die assembly of claim 15 wherein the upper metallization features are made from the same material as the upper plate, and wherein the lower metallization features are made from the same material as the lower plate.

17. The semiconductor die assembly of claim 15 wherein:
    the upper metallization features are formed on a peripheral region of the lower surface of the upper one of the adjacent pair of semiconductor dies, and the upper plate is formed on a central region of the lower surface of the upper one of the adjacent pair of semiconductor dies, and
    the lower metallization features are formed on a peripheral region of the upper surface of the lower one of the adjacent pair of semiconductor dies, and the lower plate is formed on a central region of the upper surface of the lower one of the adjacent pair of semiconductor dies.

18. The semiconductor die assembly of claim 15 wherein the upper metallization feature of each interconnect is aligned with the lower metallization feature of the interconnect, and wherein each interconnect further comprises a solder ball or a solder bump coupling the upper metallization feature to the lower metallization feature.

19. The semiconductor die assembly of claim 12 wherein each individual semiconductor die is electrically coupled to at least one of the parallel plate capacitors and the power supply via the interconnects, and wherein the at least one parallel plate capacitor provides a more proximate source of power than the power supply to the individual semiconductor die.

20. The semiconductor die assembly of claim 12 including at least eight semiconductor dies.

21. A method of manufacturing a semiconductor die assembly, comprising:
   forming a plurality of first metallization features on a surface of a first semiconductor die, the first metallization features electrically coupled to through silicon vias (TSVs) extending through the first semiconductor die;
   while forming the plurality of first metallization features, forming a first capacitor plate on the surface of the first semiconductor die, the first capacitor plate electrically coupled to at least one of the first metallization features;
   forming a plurality of second metallization features on a surface of a second semiconductor die;
   while forming the plurality of second metallization features, forming a second capacitor plate on the surface of the second semiconductor die, the second capacitor plate electrically coupled to at least one of the second metallization features;
   stacking the second semiconductor die over the first semiconductor such that at least a portion of the second capacitor plate is over the first capacitor plate; and
   forming a dielectric material at least partially between the first capacitor plate and the second capacitor plate.

22. The method of claim 21, further comprising electrically coupling the first metallization features to the second metallization features via a plurality of electrical connectors disposed therebetween, wherein the electrical connectors are at least one of solder balls or solder joints.

23. The method of claim 21 wherein:
   the surface of the first semiconductor die includes a first portion and a second portion, the first metallization features are formed on the first portion of the surface of the first semiconductor die, and the first capacitor plate is formed on substantially all of the second portion of the surface of the first semiconductor die; and
   the surface of the second semiconductor die includes a first portion and a second portion, the second metallization features are formed on the first portion of the surface of the second semiconductor die, and the second capacitor plate is formed on substantially all of the second portion of the surface of the second semiconductor die.

24. A method of manufacturing a semiconductor die assembly, comprising:
   providing a first semiconductor die having a first metal structure formed on a surface of the first semiconductor die;
   stacking a second semiconductor die over the first semiconductor die such that a second metal structure formed on a surface of the second semiconductor die is at least partially aligned with the first metal structure; and
   forming a dielectric material at least partially between the first metal structure and the second metal structure, wherein the first metal structure, second metal structure, and dielectric material together form a parallel plate capacitor.

25. The method of claim 24, further comprising:
   forming a plurality of interconnects between the first semiconductor die and the second semiconductor die, wherein each interconnect includes a first metallization feature formed on the surface of the first semiconductor die and a second metallization feature formed on the surface of the second semiconductor die, wherein the first metallization feature and second metallization feature are axially aligned and electrically coupled via an electrical connector disposed therebetween, wherein the first metallization feature and the first metal structure are made from the same material, and wherein the second metallization feature and the second metal structure are made from the same material.

* * * * *